United States Patent
Ding et al.

(10) Patent No.: US 8,248,107 B2
(45) Date of Patent: Aug. 21, 2012

(54) HIGH-SPEED DIFFERENTIAL COMPARATOR CIRCUITRY WITH ACCURATELY ADJUSTABLE THRESHOLD

(75) Inventors: Weiqi Ding, Fremont, CA (US); Mingde Pan, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 171 days.

(21) Appl. No.: 12/722,319

(22) Filed: Mar. 11, 2010

(65) Prior Publication Data

US 2011/0221477 A1    Sep. 15, 2011

(51) Int. Cl.
*H03F 3/45*    (2006.01)
(52) U.S. Cl. ............... 327/55; 327/56; 327/65
(58) Field of Classification Search .......... 327/52, 327/53, 55, 56, 65–68
See application file for complete search history.

(56) References Cited

U.S. PATENT DOCUMENTS

| 5,396,131 | A  | * | 3/1995  | Miki et al. ............... 327/65 |
| 5,517,134 | A  | * | 5/1996  | Yaklin ..................... 327/65 |
| 6,002,299 | A  | * | 12/1999 | Thomsen .................. 330/9 |
| 6,760,381 | B2 | * | 7/2004  | Lu .......................... 375/257 |
| 7,102,392 | B2 | * | 9/2006  | Hsu et al. .................. 327/20 |
| 7,224,191 | B1 | * | 5/2007  | Wang et al. ............... 327/60 |
| 7,486,114 | B2 | * | 2/2009  | Chen et al. ................ 327/20 |
| 2002/0041197 | A1 | | 4/2002  | Yamauchi et al. |
| 2002/0167339 | A1 | | 11/2002 | Chang et al. |
| 2005/0035788 | A1 | | 2/2005  | Devendorf et al. |
| 2006/0044023 | A1 | | 3/2006  | Yun et al. |
| 2009/0153199 | A1 | | 6/2009  | Kobayashi |

* cited by examiner

*Primary Examiner* — Kenneth B. Wells
(74) *Attorney, Agent, or Firm* — Ropes & Gray LLP

(57) ABSTRACT

A high-speed differential comparator circuit is provided with an accurately adjustable threshold voltage. Differential reference voltage signals are provided to control the threshold voltage of the comparator. The common mode voltage of the reference signals preferably tracks the common mode voltage of the differential high-speed serial data signal being processed by the comparator circuit.

21 Claims, 6 Drawing Sheets

US 8,248,107 B2

HIGH-SPEED DIFFERENTIAL COMPARATOR CIRCUITRY WITH ACCURATELY ADJUSTABLE THRESHOLD

BACKGROUND

High-speed differential comparators (or slicers) play an important role in high-speed serial interface ("HSSI") applications (e.g., for data signalling between two or more integrated circuit ("IC") devices on a printed circuit board ("PCB")). Clock and data recovery ("CDR") circuitry, decision feedback equalizer ("DFE") circuitry, and eye viewer circuitry all typically use high-speed comparators to sample/slice an input signal (e.g., a high-speed serial data signal) to determine (make a decision) as to whether the logical or data level of the input signal is binary 1 or binary 0 at each instant of time. The threshold voltage of known high-speed differential comparators is typically fixed at zero volts. However, in many applications a high-speed comparator circuit with a variable differential threshold would be desirable. For example, if the eye diagram of the input data signal is not symmetrical in the vertical direction (i.e., about a horizontal axis corresponding to a particular signal voltage level), sampling that data signal with a non-zero threshold can advantageously provide margins for a lower error rate. (The eye diagram of a data signal results from superimposing on a single unit interval of the signal multiple data bits from the signal. The unit interval ("UI") is the time duration of any one bit in the data signal. The horizontal axis of a typical eye diagram is time, and the vertical axis is signal voltage.) Another example is an eye viewer design, which can benefit from having a variable threshold sampler to sweep the input signal to reconstruct an eye diagram. (Eye viewer circuitry can be circuitry that analyzes an input data signal over time in order to collect and assemble information about that signal suitable for providing a graphical display or other output indicative of the eye diagram of the data signal.) This disclosure addresses needs of the foregoing kinds.

SUMMARY

In accordance with certain possible aspects of the disclosure, a high-speed differential comparator circuit is given a variable threshold voltage by adding an extra differential transistor pair to the circuit. The differential voltage of the comparator threshold may be accurately controlled by an added reference generation circuit. Also, the common mode of the reference voltage may be maintained to be the same as that of the input signal to minimize variations.

Further features of the disclosure, its nature and various advantages will be more apparent from the accompanying drawings and the following detailed description.

BRIEF DESCRIPTION OF THE DRAWINGS

FIG. 1 also includes several illustrative signal waveforms that depict signal status at various points or nodes in the FIG. 1 circuitry under various operating conditions of that circuitry. All of the FIG. 1 waveforms are plotted against the same, horizontal, time axis, along which elapsed time increases to the right.

DETAILED DESCRIPTION

Figure 1:
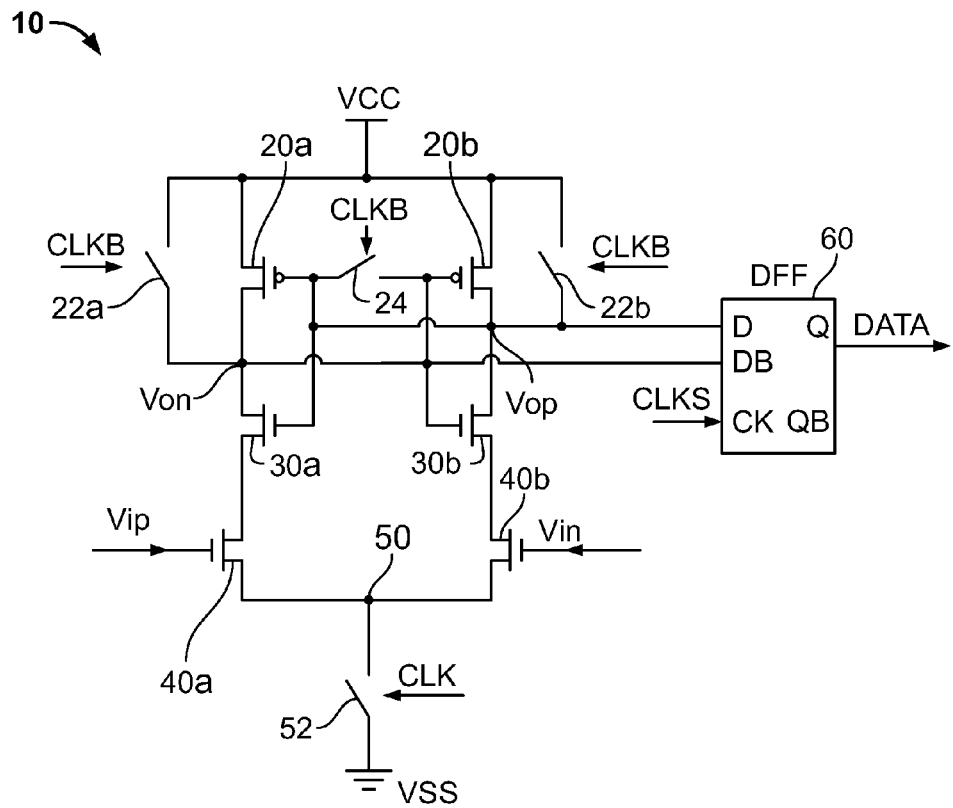
FIG. 1 is a simplified schematic block diagram of illustrative, known, differential comparator circuitry.
Figure 1:
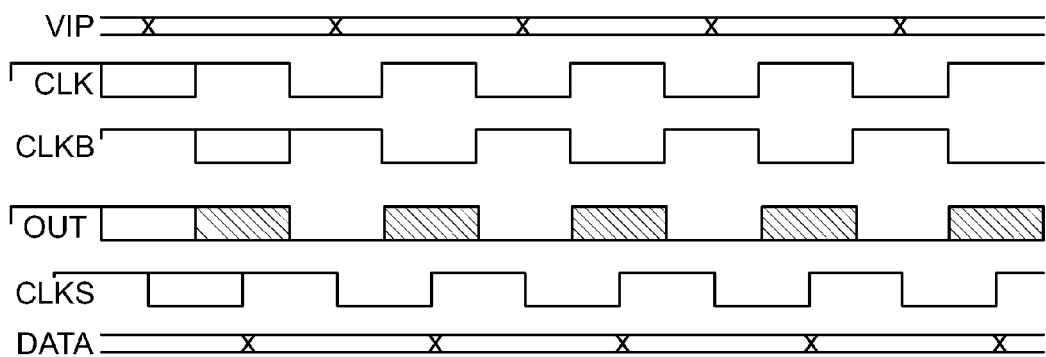

An illustrative, known, high-speed differential comparator circuit 10 in typical transceiver circuitry is shown in FIG. 1. Circuitry 10 is "differential" circuitry because it receives and processes a high-speed, serial, digital (i.e., binary), data signal that is actually two complementary (or differential) signals Vip and Vin. In other words, whenever Vip is at the higher of its two (binary) voltages, Vin is at the lower of its two (binary) voltages. Similarly, whenever Vip is at the lower of its two voltages, Vin is at the higher of its two voltages. Although the serial data signal is thus actually two complementary signals, it will sometimes be referred to herein in the singular form (e.g., "data signal," "serial data signal," or the like), and this may be done for either the input data signal, the output data signal (which is also typically differential in actuality), or any other differential signal anywhere in the circuitry. For example, the input data signal may sometimes be abbreviated to (or representatively indicated by) Vip alone. Similarly, the differential output data signal D and DB may sometimes be abbreviated to (or representatively indicated by) OUT alone. Where it is necessary to make individual reference to the two complementary signals that form a differential signal pair, each such individual signal may be referred to as a constituent of the differential signal.

As shown in FIG. 1, comparator circuit 10 includes two similar circuits that are connected in parallel with one another between power supply voltage VCC and ground voltage VSS. One of these circuits includes PMOS transistor 20a, NMOS transistor 30a, and NMOS transistor 40a, whose source-drain paths are connected in series with one another (in the order in which the transistors have just been mentioned) between VCC and a node 50 that is connectable to ground. The other circuit of comparator 10 includes PMOS transistor 20b, NMOS transistor 30b, and NMOS transistor 40b, whose source-drain paths are connected in series with one another (in the order just mentioned) between VCC and node 50. The gates of transistors 20a and 30a are connected to one another, and also to a data-out node Vop or D, which is between the source-drain paths of transistors 20b and 30b. The gates of transistors 20b and 30b are connected to one another, and also to a complementary data-out node Von or DB, which is between the source-drain paths of transistors 20a and 30a. The source-drain path of transistor 20a is selectively short-circuitable by switch 22a, which is connected in parallel with that source-drain path. The source-drain path of transistor 20b is similarly short-circuitable by switch 22b, which is connected in parallel with that source-drain path. Switches 22a and 22b are electrically closed whenever a clock signal CLKB is asserted (i.e., whenever CLKB is logic 1 or high in the CLKB waveform shown in FIG. 1). Switches 22a and 22b are electrically open whenever CLKB is not asserted (i.e., whenever CLKB is logic 0 or low in the CLKB waveform shown in FIG. 1). Closing switches 22 short-circuits the source-drain paths of transistors 20.

The gates of transistors 20a and 20b are selectively connected to one another via switch 24. Switch 24 is electrically closed (thereby interconnecting the gates of transistors 20a and 20b) whenever CLKB is asserted. Switch 24 is electrically open whenever CLKB is not asserted.

Vip is applied to the gate of transistor 40a. Vin is applied to the gate of transistor 40b. Node 50 is selectively connectable to VSS via switch 52. Switch 52 is electrically closed (thereby connecting node 50 to VSS) whenever a clock signal CLK is asserted. (CLK is the complement (logical inverse) of CLKB.) Switch 52 is electrically open whenever CLK is not asserted.

All of switches 22, 24, and 52 are typically transistor switches.

The complementary data outputs D and DB of the thus-far described circuitry are applied to the similarly-named complementary inputs of D-type flip-flop ("DFF") circuitry 60. DFF 60 is clocked by a sampling clock signal CLKS. As can be seen from the waveforms shown in the lower part of FIG. 1 (all of which waveforms are plotted against a same (common) horizontal time axis, along which elapsed time increases from left to right), CLKS is typically about 90 degrees out of phase with (i.e., delayed in time relative to) CLK. (CLKB is, of course, 180 degrees out of phase with CLK.) DFF 60 is controlled by CLKS to sample D and DB on each rising edge (or level transition) in CLKS. DFF 60 subsequently outputs (as its DATA output signal) the logical level that it found when it sampled D and DB as just described.

During the phase of the CLK/CLKB signal in which CLKB is asserted (i.e., is logical 1 or at its higher voltage level), comparator 10 is in what may be referred to as a reset state in which Vop (or D) and Von (or DB) are both equal to VCC (because switches 22a and 22b are both electrically closed). However, during the phase of the CLK/CLKB signal in which CLK is asserted (i.e., is logical 1 or at its higher voltage level), comparator 10 is in what may be referred to as its active state. In this state Vop and Von are driven to high or low based on differential input Vip minus Vin (Vip−Vin) due to the cross-coupled feedback. DFF 60 latches Vop/Von at the rising edge of CLKS to generate the sampled DATA signal.

Note that in comparator 10, the differential threshold voltage of the comparator is fixed at 0. This means that DATA is high (logic or binary 1) if Vip−Vin is greater than 0 volts, and DATA is low (logic or binary 0) if Vip−Vin is less than 0 volts.

Figure 2:
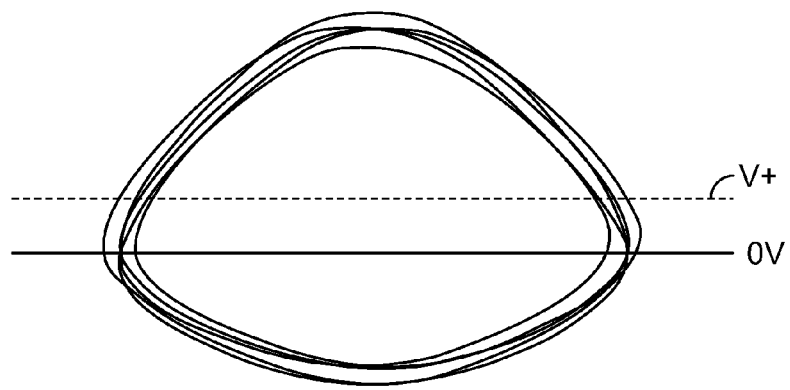
FIG. 2 is a simplified diagram of several signal waveform samples that have all been superimposed on one unit interval to produce an eye diagram or eye-type diagram. This diagram is useful in explaining certain possible aspects of the disclosure.

As was mentioned in the background section of this specification, there are several applications of differential comparator circuitry (of the type generally described above) that would benefit from being able to vary the threshold voltage of the comparator. One example of such an application is in clock and data recovery ("CDR") circuitry. CDR circuitry is typically used at an early stage in circuitry for receiving a high-speed serial data signal. Such CDR circuitry may be in an integrated circuit device that is receiving the data signal from another integrated circuit device, e.g., via a circuit trace on a printed circuit board on which both integrated circuits are mounted. The CDR circuit may be used (for example) to decide when the incoming data signal is at a logical high voltage level and therefore representing a binary data 1; and conversely, to decide when the incoming data signal is at a logical low voltage level and therefore representing a binary data 0. As shown in FIG. 2, the eye diagram (i.e., the closed-loop signal traces shown in FIG. 2) of the input serial data signal seen by CDR circuitry is often not symmetrical about a 0 volt threshold ("0V"). Sampling at a different, non-zero threshold (e.g., at V+ in FIG. 2) would improve the data error rate of the CDR circuitry.

Figure 3:
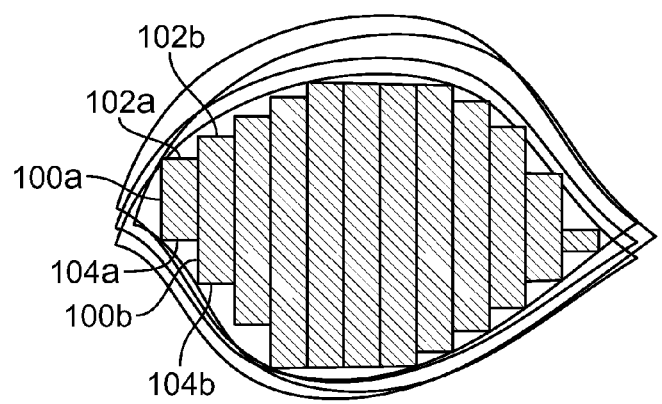
FIG. 3 is another simplified eye-type diagram that is useful in explaining certain other possible aspects of the disclosure.

Another example of an application that would benefit from having a comparator of the general type described above, but with a variable threshold, is eye viewer circuitry (i.e., circuitry for producing output information of the type illustrated by FIG. 3). As shown in FIG. 3, eye viewer circuitry typically attempts to provide a graphical depiction (or other similar kind of indication) of the area that is open (i.e., not traversed by any part of either the Vip signal trace or the Vin signal trace) inside the eye of a received serial data signal. This may be done as a series of bars 100a, 100b, etc., that are distributed across the (horizontal) width of the data eye. The top 102a, etc., and bottom 104a, etc., of each bar (which must be found (determined) by the eye viewer circuitry) is typically located where the bar begins to intersect with any of the signal traces that form the serial data signal eye. To determine such top and bottom locations for each bar 100, it is helpful for the signal slicer used in the eye viewer circuitry to have a variable threshold. For example, to determine the top 102 of a bar 100, the variable threshold may be gradually increased until no 0-valued data bits are detectable (using that temporarily increased threshold) at the (timing) location of that bar. Similarly, to determine the bottom 104 of a bar 100, the variable threshold may be gradually decreased until no 1-valued data bits are detectable (using that temporarily increased threshold) at the location of that bar.

Figure 4:
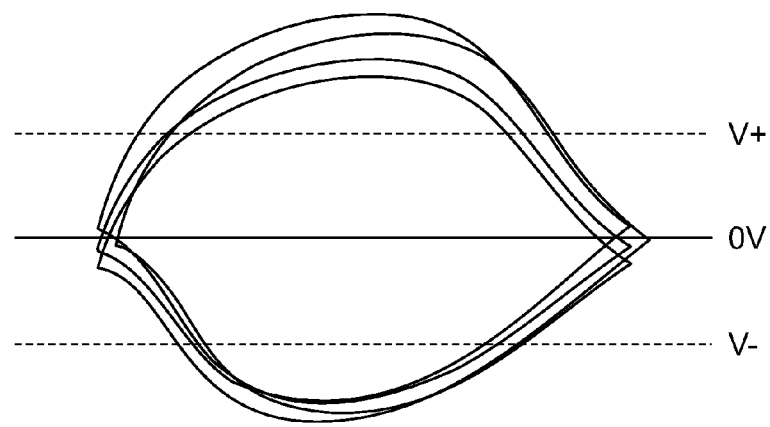
FIG. 4 is still another simplified eye-type diagram that is useful in explaining still other possible aspects of the disclosure.

Still another example of an application that can benefit from having a comparator of the general type show in FIG. 1, but with a variable threshold, is decision feedback equalizer ("DFE") circuitry. For example, partial response DFE circuitry may need to sample a serial data signal at more than one threshold (e.g., V+ and V− in the eye diagram signal information shown in FIG. 4). As FIG. 4 shows, V+ is a slicer threshold voltage above the nominal 0V threshold voltage, and V− is a slicer threshold voltage below the nominal 0V threshold voltage.

Figure 5:
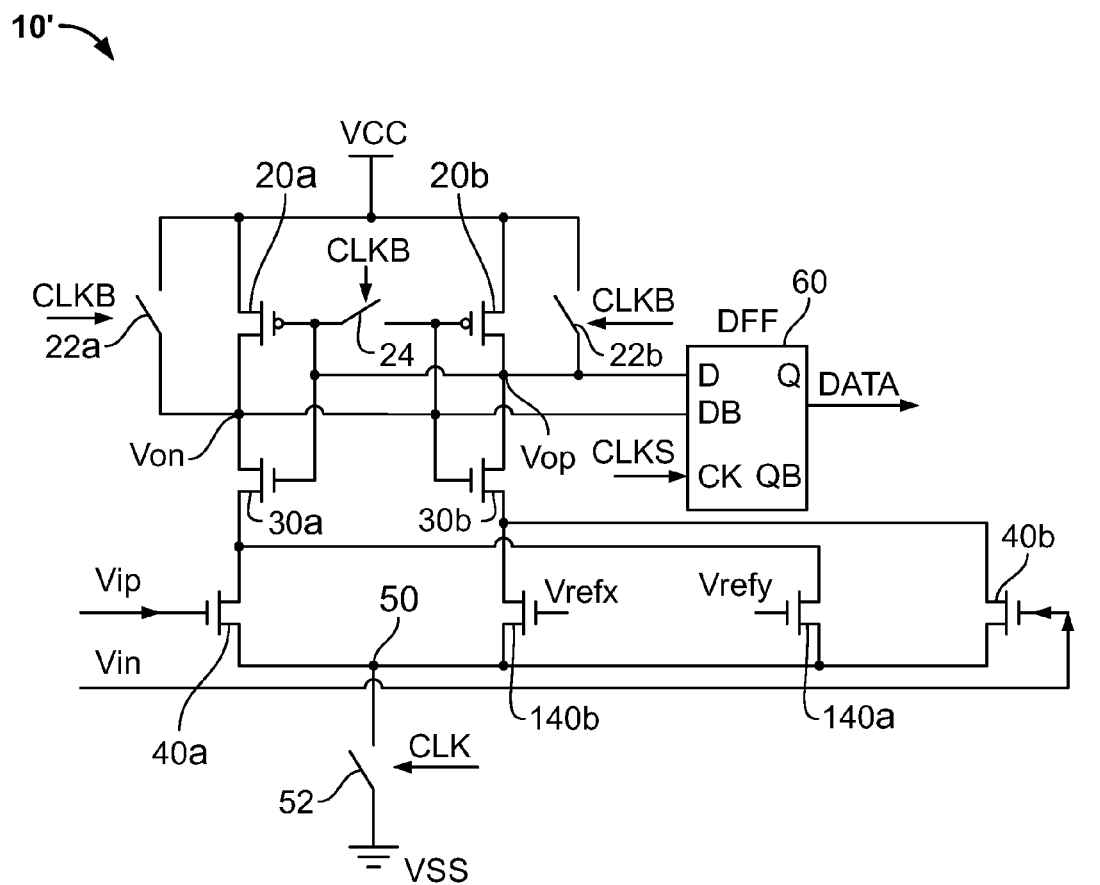
FIG. 5 is generally similar to FIG. 1, but shows an illustrative embodiment of differential comparator circuitry with a controllably variable threshold voltage in accordance with certain possible aspects of the disclosure.
Figure 5:
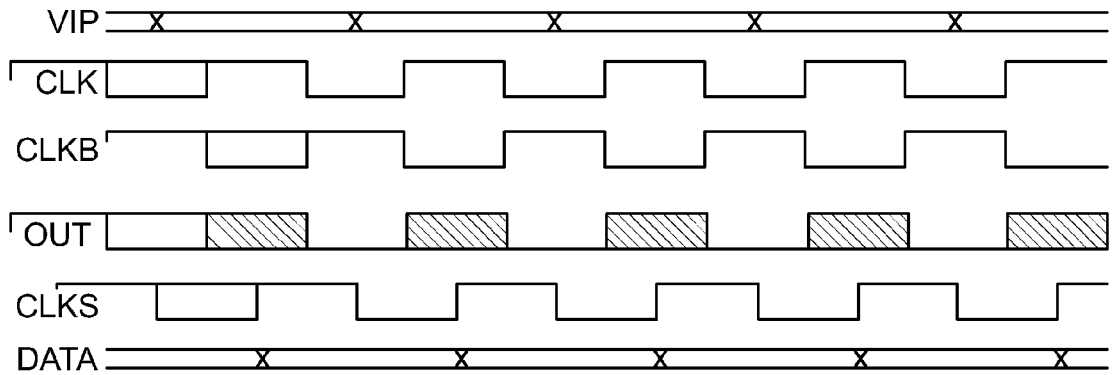

An illustrative embodiment of a differential comparator 10' with a controllably variable threshold voltage in accordance with this disclosure is shown in FIG. 5. Comparator 10' is similar to comparator 10 in many respects. Elements that are common to these two comparators have the same reference numbers in FIGS. 1 and 5 and will not need to be described again in connection with FIG. 5. The major differences are the addition of NMOS transistor 140a in parallel with transistor 40a, and the addition of NMOS transistor 140b in parallel with transistor 40b. In particular, the source-drain path of transistor 140a is connected in parallel with the source-drain path of transistor 40a, and the source-drain path of transistor 140b is connected in parallel with the source-drain path of transistor 40b. The gate of transistor 140a is connected to a controllably variable source of reference voltage Vrefy. The gate of transistor 140b is connected to a controllably variable source of reference voltage Vrefx. Vrefy and Vrefx (collectively a differential reference voltage signal) are preferably independently controllable so that the difference between them is controllable. In particular, the differential threshold voltage of comparator 10' is equal to Vrefx−Vrefy, and this difference can be controlled (by controlling one or both of Vrefx and Vrefy) to be (1) 0 volts (giving comparator 10' the same operating characteristics as comparator 10), (2) greater than 0 volts, or (3) less than 0 volts. Thus DATA (the output of flip-flop 60 in FIG. 5) is high if (Vip−Vin)>(Vrefx−Vrefy), and DATA is low if (Vip−Vin)<(Vrefx−Vrefy).

The circuitry that generates the differential reference voltage Vrefx−Vrefy is preferably insensitive to variations in the factors known as PVT (where P stands for variations in the process used to manufacture or fabricate the IC, V stands for variations in ambient power supply voltage of the IC, and T stands for variations in the operating temperature of the IC). On the other hand, the differential reference voltage Vrefx−Vrefy is preferably controllably variable, and this control may be either dynamic (e.g., time-varying in response to various operating conditions and/or modes of the IC), static (e.g., programmable in the case of an IC like a programmable logic device ("PLD") that can be programmed by a user of the device), or a combination of dynamic and static (e.g., dynamic during one phase of operation of the IC, and then fixed or constant during a subsequent phase of operation of the IC).

It may be desirable for the common mode voltage (i.e., the voltage that is mid-way between the voltage swings of the two complementary signals that make up a differential signal) of Vrefx/Vrefy to match the common mode voltage of Vip/Vin. Otherwise the threshold will change as the common mode voltage changes.

Figure 6:
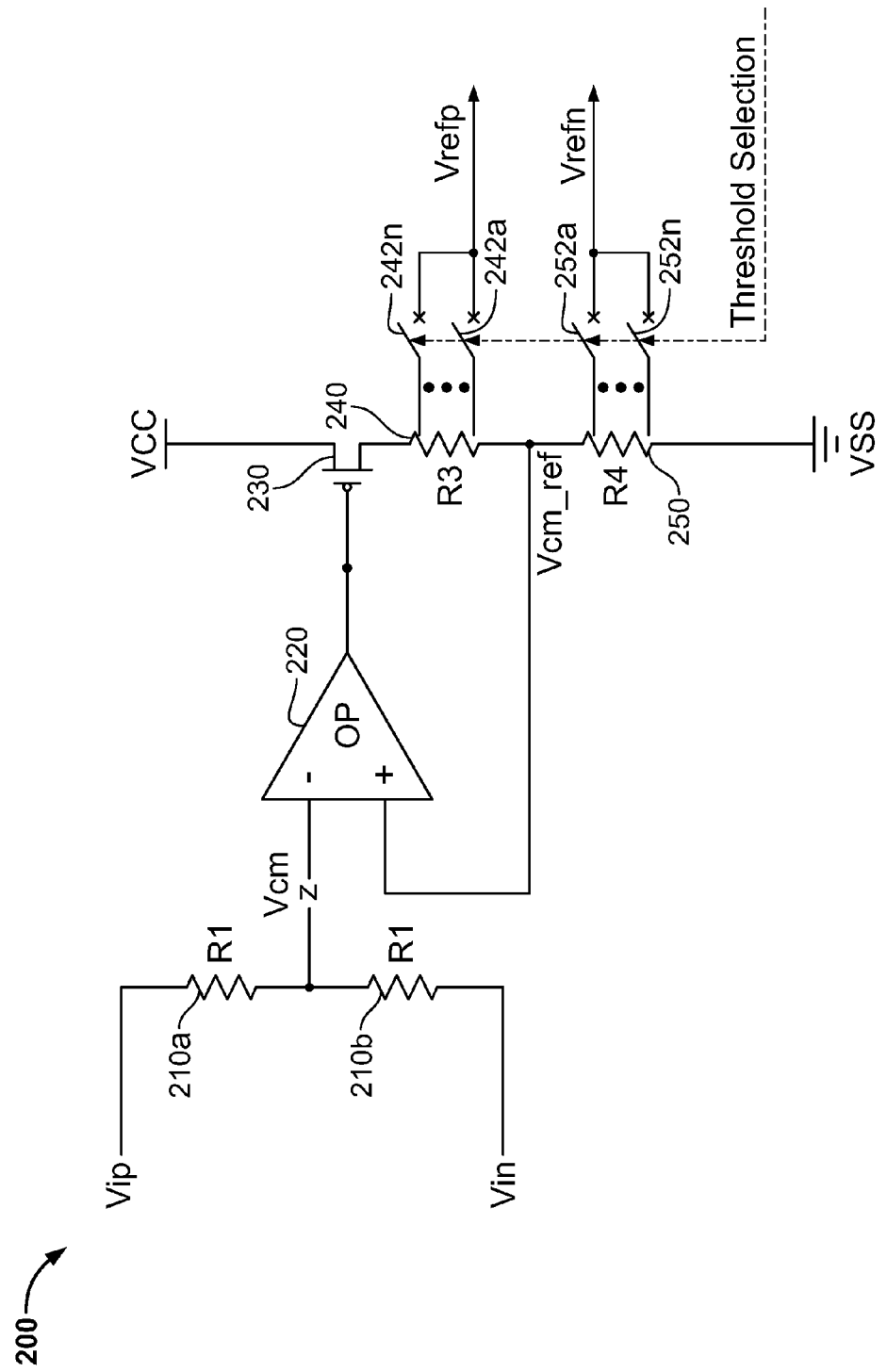
FIG. 6 is a simplified schematic block diagram of an illustrative embodiment of circuitry that may be used in connection with circuitry of the type shown in FIG. 5 in accordance with certain possible aspects of the disclosure.
Figure 7:
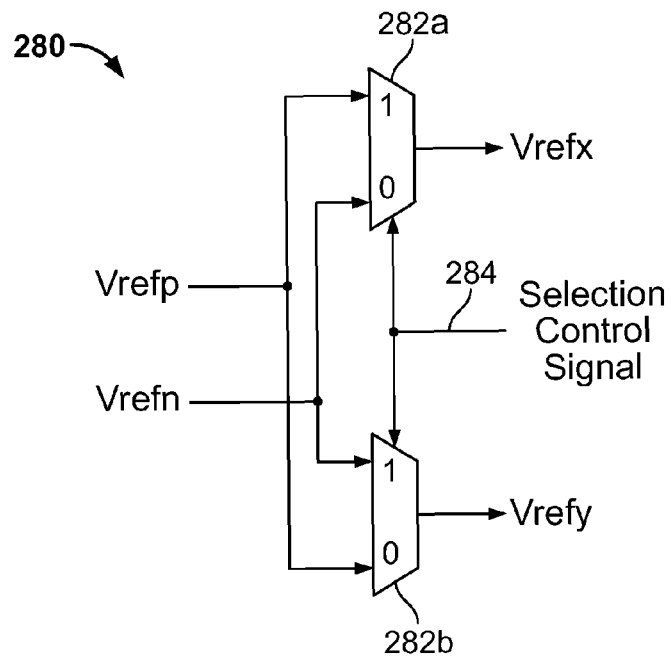
FIG. 7 is a simplified schematic block diagram of an illustrative embodiment of circuitry that can be used for making connections between the FIG. 6 and FIG. 5 circuitries in accordance with certain possible aspects of the disclosure.

FIG. 6 shows an illustrative embodiment of circuitry 200 for generating controllably variable threshold signals Vrefp and Vrefn. FIG. 7 shows an illustrative embodiment of circuitry 280 for controllably connecting either Vrefp or Vrefn from FIG. 6 to Vrefx in FIG. 5, and for similarly controllably connecting either Vrefn or Vrefp from FIG. 6 to Vrefy in FIG. 5. In particular, circuitry 280 ensures that whichever one of Vrefp and Vrefn is connected to Vrefx, then the other one of Vrefp and Vrefn is concurrently connected to Vrefy. Circuitry 280 will be described in more detail after the following further discussion of FIG. 6.

In circuitry 200 Vip and Vin (as in FIG. 5) are connected to one another across voltage-dividing (series-connected) resistor pair 210a and 210b. The resistance value (R1) of both resistors 210 in this pair is the same. The node between resistors 210 has the common mode voltage Vcm. This node is connected to one of the input terminals of operational amplifier ("op amp") 220. The output signal of op amp 220 is applied to the gate of PMOS transistor 230. The source-drain path of transistor 230 is connected in series with resistor 240 between power supply voltage VCC and the node labelled Vcm_ref. Resistor 250 is connected in series between Vcm_ref and VSS or ground. Vcm_ref is also connected to the other input to op amp 220. Each of resistors 240 and 250 has a plurality of taps (e.g., n taps, where n is an integer greater than 1) at various points along its "length" (i.e., overall resistance). Any one of these taps can be selected to provide a particular value of Vrefp (in the case of resistor 240) or Vrefn (in the case of resistor 250) by closing the switch 242 or 252 leading from that particular tap to the Vrefp or Vrefn node, respectively. (The above-mentioned "taps" may sometimes be referred to by the reference number of the switch 242 or 252 connected to that tap. Thus, for example, "tap 242a" is the tap on resistor 240 that leads to switch 242a; "tap 242b" is the tap on resistor 240 that leads to switch 242b; and "tap 252n" is the tap on resistor 250 that leads to switch 252n. Switches 242a-n and 252a-n are typically transistor switches.) The signals labelled "threshold selection" are signals for controlling which one (and only one) of switches 242 is closed at any given time, and also which one (and only one) of switches 252 is also closed at that time. These threshold selection signals will be further discussed later to this specification.

From the foregoing it will be seen that the differential voltage Vrefp−Vrefn can be accurately selected (e.g., dynamically or more statically (or programmably)) by selecting taps 242/252 on the resistor ladder. The common mode voltage Vcm_ref of Vrefp/Vrefn tracks (or is at least linked to) the common mode Vcm of Vip/Vin using the feedback loop including op amp 220 and PMOS transistor 230.

As has been mentioned, FIG. 7 shows circuitry 280 for connecting Vrefp and Vrefn in FIG. 6 to Vrefx and Vrefy in FIG. 5 with either of the two possible polarities of such connections (i.e., with either (1) a "first polarity" in which Vrefp is connected to Vrefx and Vrefn is connected to Vrefy, or (2) a "second polarity" in which Vrefn is connected to Vrefx and Vrefp is connected to Vrefy). Circuitry 280 includes first multiplexer ("mux") circuitry 282a and second mux circuitry 282b. Each of muxes 282 has two selectable inputs and a selection control input. Vrefp (from FIG. 6) is applied to one of the selectable inputs to each of muxes 282. Vrefn (from FIG. 6) is applied to the other selectable input of each of muxes 282. Selection control signal 284 is applied to the selection control input of each of muxes 282. The output signal of mux 282a is Vrefx (applied to Vrefx in FIG. 5). The output signal of mux 282b is Vrefy (applied to Vrefy in FIG. 5). Each mux 282 can output either one of its two selectable inputs (Vrefp or Vrefn), depending on the logical state (e.g., logical (binary) 1 or logical (binary) 0) of selection control signal 284. In particular (and as shown by the "1" and "0" in each of muxes 282 in FIG. 7), when selection control signal 284 is 1, mux 282a outputs Vrefp as Vrefx and mux 282b outputs Vrefn as Vrefy. On the other hand, when selection control signal 284 is 0, mux 282a outputs Vrefn as Vrefx and mux 282b outputs Vrefp as Vrefy. Thus circuitry 280 controllably allows either of Vrefp and Vrefn to be applied (in a way that is always complementary) to either of Vrefx and Vrefy.

When circuitry 280 is controlled to connect Vrefp from FIG. 6 to Vrefx in FIG. 5, and to similarly connect Vrefn from FIG. 6 to Vrefy in FIG. 5, circuitry 200 can be controlled to raise the threshold voltage of circuitry 10' above 0V. The amount by which the threshold of circuitry 10' is raised above 0V is determined by which of switches 242 and/or 252 is closed. In general, closing a switch 242 for a tap on resistor 240 that is closer to transistor 230 and/or closing a switch 252 for a tap on resistor 250 that is closer to VSS tends to increase the threshold of circuitry 10' by a greater amount above 0V. On the other hand, closing a switch 242 for a tap on resistor 240 that is closer to the Vcm_ref node and/or closing a switch 252 for a tap on resistor 250 that is closer to the Vcm_ref node tends to increase the threshold of circuitry 10' by a smaller amount above 0V.

Alternatively to the immediately preceding paragraph, when circuitry 280 is controlled to connect Vrefn in FIG. 6 to Vrefx in FIG. 5, and to similarly connect Vrefp in FIG. 6 to Vrefy in FIG. 5, circuitry 200 can be controlled to lower the threshold voltage of circuitry 10' below 0V. This threshold voltage lowering is greater when a switch 242 closer to transistor 230 is closed and/or when a switch 252 closer to VSS is closed. The threshold voltage lowering (below 0V) is less when switches 242 and/or 252 closer to Vcm_ref are closed.

To help ensure that circuitry 200 does not interfere with the ability of circuitry 10' to also have a threshold of 0V if and when desired, one of taps 242 (e.g., tap 242a) and one of taps 252 (e.g., tap 252a) may be connected to the Vcm_ref node (i.e., with no actual resistor 240 or 250 voltage change from the voltage at Vcm_ref). Selection of these taps causes Vrefp−Vrefn=0, which allows the threshold of circuitry 10' to remain at 0V.

Figure 8:
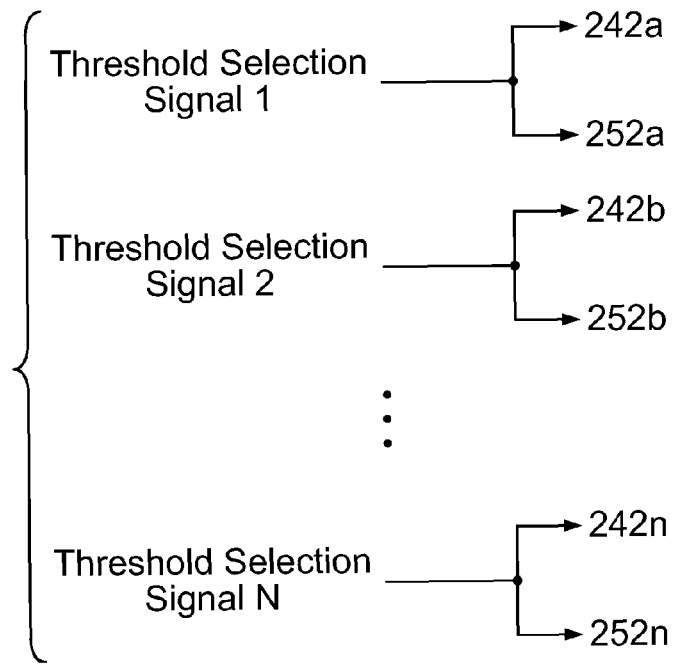
FIG. 8 is a simplified schematic diagram of an illustrative embodiment of circuitry that can be used for controlling certain circuit elements in FIG. 6 in accordance with certain possible aspects of the disclosure.
Figure 9:
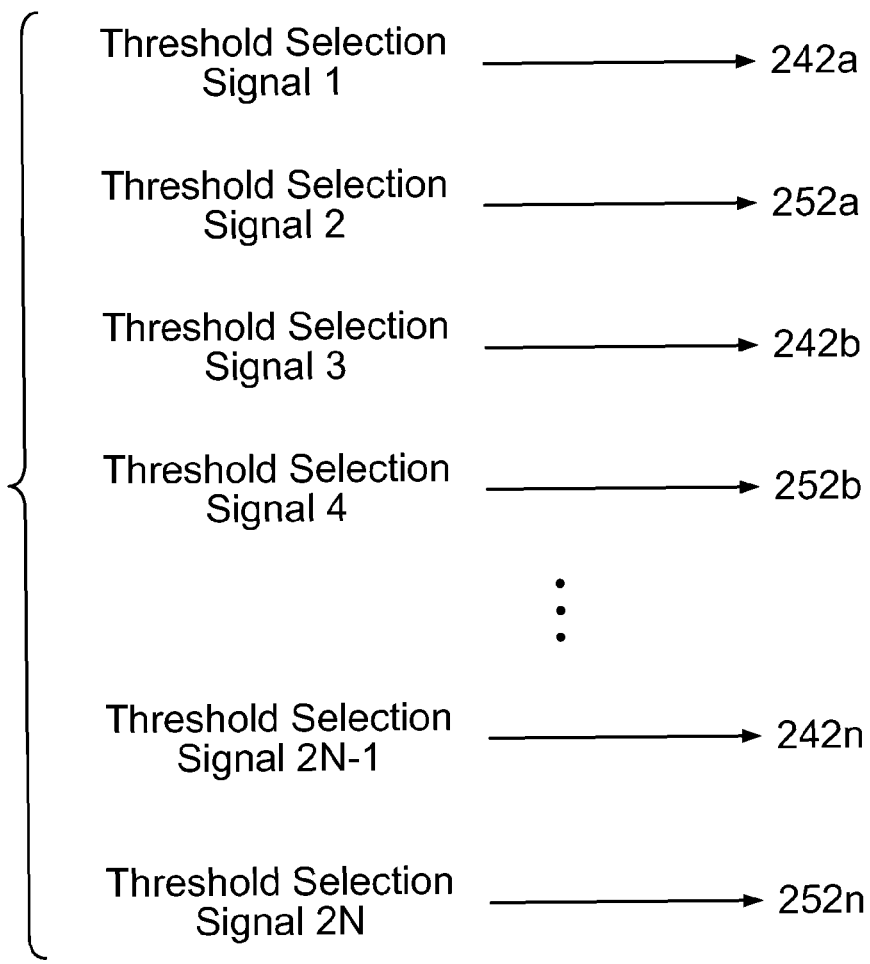
FIG. 9 is a simplified schematic diagram of an alternative embodiment of FIG. 8 type circuitry in accordance with certain possible aspects of the disclosure.

FIGS. 8 and 9 show two alternative ways in which taps 242 and 252 may be controllably selected. These FIGS. (especially FIG. 8) assume that taps 242a-n are generally arranged in order from tap 242a being at or closest to Vcm_ref along resistor 240 and tap 252a being at or closest to Vcm_ref along resistor 250. (For completeness, this assumption means that each of taps 242n and 252n is most distant from Vcm_ref along the respective resistor 240 or 250.) At least FIG. 8 also assumes that any two corresponding taps 242i and 252i (where in both cases i has any (same) value from a to n) have the same absolute value of resistive voltage difference from Vcm_ref. FIG. 8 shows circuitry in which each tap 242 is always paired with the same, respective, tap 252. FIG. 8 further shows that the taps in each such pair are the two taps that have the same absolute value of resistive voltage difference from Vcm_ref. FIG. 8 still further shows threshold selection signals that always select both taps in each such pair in tandem. Thus, for example, assertion of threshold selection signal 1 selects taps 242a and 252a as a pair (in tandem). As another example, assertion of threshold selection signal 2 selects taps 242b and 252b as a pair (in tandem). The symmetrical tap selection that the FIG. 8 circuitry ensures causes the common mode voltage of Vrefp and Vrefn to always equal Vcm_ref, which can be an advantage.

In contrast to FIG. 8, FIG. 9 shows alternative circuitry that allows any one of taps 242a-n to be selected in combination with any one of taps 252a-n. In other words, in FIG. 9 the threshold selection signals that control selection of taps 242 are independent of the threshold selection signals that control selection of taps 252. This gives the possibility of a greater number of different threshold settings for circuitry 10' (for a given number of taps). A possible downside, however, is that the common mode voltage of Vrefp and Vrefn is no longer necessarily equal to Vcm_ref.

Figure 10:
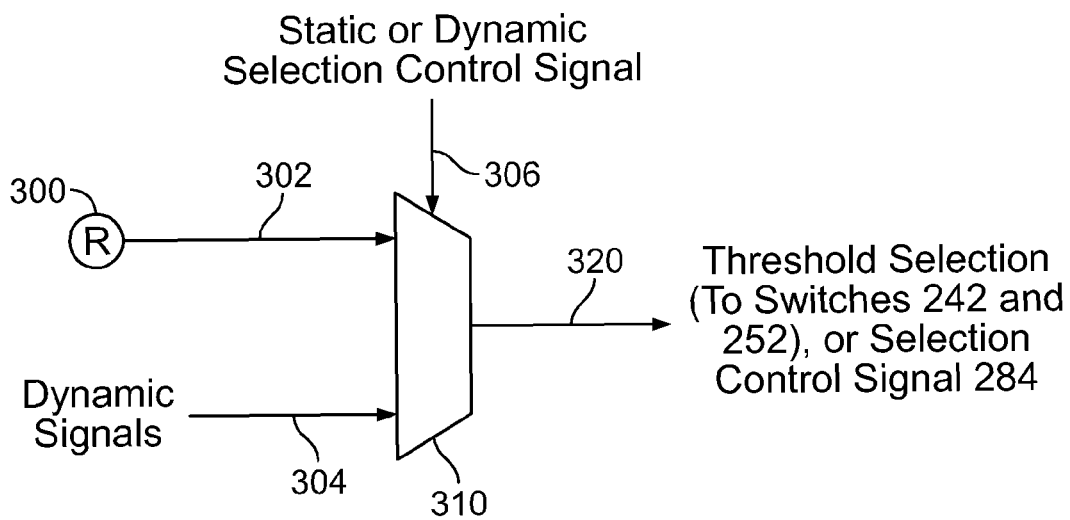
FIG. 10 is a simplified block diagram of an illustrative embodiment of further circuitry that can be used with the FIGS. 6, 7, 8, and/or 9 circuitry in accordance with certain possible aspects of the disclosure.

FIG. 10 shows an example of how the threshold selection signals in FIGS. 6, 8, and 9, and/or selection control signal 284 in FIG. 10, may be produced. As shown in FIG. 7, multiplexer circuitry 310 has one or more selectable inputs 302 from register or memory circuitry 300 (e.g., on the integrated circuit that includes the other circuitry shown herein). For example, this memory circuitry 300 may be programmable or configurable when the integrated circuit is first started or restarted. Because such programming or configuration occurs relatively infrequently, signals 302 may be constant or relatively constant ("static") over time during subsequent normal mode use or operation of the integrated circuit. The other selectable inputs 304 may be more dynamic signals, e.g., from other circuitry in the integrated circuit. These signals may be subject to change over time during the course of normal operations (or certain normal operations) of the integrated circuit. Selection control signal 306 (which can be either static like signals 302, and therefore from a similar type of source like 300; or more dynamic like signals 304, and therefore from a similar type of dynamic signal source) controls whether mux 310 passes (1) signals 302, or (2) signals 304 to its outputs 320. Mux outputs 320 can be the threshold selection signals that determine which one of switches 242 is closed, while keeping the other switches 242 open. Signals 320 can similarly be the signals that determine which one of switches 252 is closed, while keeping the other switches 252 open. As still another possibility, a signal 320 can be the signal 284 that controls how muxes 282 connect Vrefp and Vrefn to the inputs Vrefx and Vrefy to circuitry 10'.

To some extent recapitulating and/or extending the foregoing, illustrative differential comparator circuitry 10 in accordance with the disclosure may include first and second circuits (e.g., 20a/30a/40a and 20b/30b/40b, respectively) that are connected in parallel with one another between a source of power supply voltage VCC and a first node 50 that is connectable to ground (VSS). The first circuit may include a first output portion (e.g., 20a/30a) and a first NMOS transistor 40a. The second circuit may include a second output portion (e.g., 20b/30b) and a second NMOS transistor 40b. First and second constituents Vip and Vin of a differential input signal may be connected to gates of the first and second NMOS transistors 40a and 40b, respectively. A third NMOS transistor 140a may have its source-drain path connected in parallel with the source-drain path of the first NMOS transistor 40a. A fourth NMOS transistor 140b may have its source-drain path connected in parallel with the source-drain path of the second NMOS transistor 40b. A source of a differential reference voltage Vrefp and Vrefn may be connected to gates of the third and fourth NMOS transistors 140a and 140b.

In circuitry as described in the preceding paragraph, the first output portion may include a first output node Vop or D, a first PMOS transistor 20a, and a fifth NMOS transistor 30a. The first PMOS transistor 20a, the fifth NMOS transistor 30a, and the first NMOS transistor 40a may be connected in series with one another via their source-drain paths. Also in circuitry as described in the preceding paragraph, the second output portion may include a second output node Von or DB, a second PMOS transistor 20b, and a sixth NMOS transistor 30b. The second PMOS transistor 20b, the sixth NMOS transistor 30b, and the second NMOS transistor 140b may be connected in series with one another via their source-drain paths. In such circuitry, the first output node Vop or D may be intermediate the source-drain paths of the second PMOS transistor 20b and the sixth NMOS transistor 30b, and the second output node Von or DB may be intermediate the source-drain paths of the first PMOS transistor 20a and the fifth NMOS transistor 30a. The gates of the first PMOS transistor 20a and the fifth NMOS transistor 30a may also be connected to the first output node Vop or D, and the gates of the second PMOS transistor 20b and the sixth NMOS transistor 30b may also be connected to the second output node Von or DB.

Circuitry as described above may further include first and second selectively closable switch circuitries 22a and 22b respectively connected in parallel with the source-drain paths of the first and second PMOS transistors 20a and 20b. This circuitry may still further include third selectively closable switch circuitry 24 connected between the gates of the first and second PMOS transistors 20a and 20b. The circuitry may yet further include fourth selectively closable switch circuitry 52 connected between the first node 50 and ground VSS. The fourth switch circuitry 52 may close in response to assertion of a clock signal CLK (and otherwise opens), and the first, second, and third switch circuitries 22a, 22b, and 24 may close in response to assertion of a complement CLKB of the clock signal CLK (and otherwise open).

Circuitry as described above may further include register circuitry 60 having differential data inputs D and DB that are connected to the first and second output portions (e.g., 20a/30a and 20b/30b, respectively). As a more particular example, such register circuitry 60 may have differential data inputs that are connected to the first and second output nodes Vop and Von, and the register may be clocked (to sample and store data indicated by the differential data inputs D and DB) by a sampling clock signal CLKS that is asserted between assertion of the clock signal CLK and assertion of the complement CLKB of the clock signal CLK. (Note in FIG. 5 that CLKS goes high after CLK goes high but before CLKB goes high. "Assertion" corresponds to a signal going high.)

In circuitry as described above, the source 200 of a differential reference voltage Vrefp and Vrefn may include a source of common mode voltage Vcm of the first and second constituents Vip and Vin of the differential input. Source 200 may further include operational amplifier circuitry 220 having a first input connected to Vcm, a second input connected to a source Vcm_ref of common mode voltage of the differential reference voltage, and an output providing a control signal for the source of Vcm_ref.

In such circuitry, the source of Vcm_ref may include a PMOS transistor 230 having a gate connected to the output of op amp 220, and a source-drain path connected in series with a resistor network 240/250 between the source of power supply voltage VCC and ground VSS.

In such circuitry the resistor network may include a first tapped resistor 240 connected in series between the source-drain path of the PMOS transistor 230 and a node Vcm_ref providing the common mode voltage of the differential reference voltage. The resistor network may further include a second tapped resistor 250 connected in series between Vcm_ref and ground VSS. Note again that Vcm_ref may be connected to the second input to op amp 220.

The above-mentioned first tapped resistor 240 may include a plurality of first taps (leading to switches 242a-n) along the first tapped resistor. There may additionally be a first plurality of switches 242a-n, each of which selectively connects a respective one of the first taps to a first reference voltage node Vrefp that supplies a first constituent of the differential reference voltage.

The above-mentioned second tapped resistor 250 may include a plurality of second taps at respective different points along the second tapped resistor. There may additionally be a second plurality of switches 252a-n, each of which selectively connects a respective one of the second taps to a second reference voltage node Vrefn that supplies a second constituent of the differential reference voltage.

In circuitry as described above, routing circuitry 280 may be provided for controllably connecting the first reference voltage node Vrefp to the gate of either one of the fourth NMOS transistor 140b or the third NMOS transistor 140a, while connecting the second reference voltage node Vrefn to the gate of the other one of those transistors.

The above-described circuitry may further include circuitry (control lead(s) labelled "threshold selection") for controlling which one of the first switches will be closed and which one of the second switches will be closed. In such structure the circuitry for controlling may be able to select any one of the first switches 242a-n to be closed. Each of the first switches 242a-n may be associated with a respective one of the second switches 252a-n which will also be closed when the associated first switch is closed.

To some extent recapitulating and/or extending certain other aspects of the foregoing, illustrative circuitry (e.g., 200) for maintaining a substantially equal common mode voltage between first (e.g., Vip/Vin) and second (e.g., Vrefp/Vrefn) differential signals may include first circuitry (e.g., 210a, 210b) for producing a first common mode voltage signal (e.g., Vcm) indicative of the common mode voltage of the first differential signal (e.g., Vip/Vin). The circuitry may further include second circuitry (e.g., 230, 240, 250) for producing the second differential signal. The second circuitry may include a PMOS transistor (e.g., 230) having a source-drain path connected in series with a resistor network (e.g., 240, 250) between a source of power supply voltage (e.g., VCC) and ground (e.g., VSS). The resistor network may have an intermediate common mode voltage node (e.g., Vcm_ref). The second differential signal (e.g., Vrep/Vrefn) may be produced from first and second taps (e.g., 242, 252) from the resistor network. The first tap may be between the source-drain path of the PMOS transistor (e.g., 230) and the common mode voltage node (e.g., Vcm_ref). The second tap may be between the common mode voltage node (e.g., Vcm_ref) and ground (e.g., VSS). The circuitry may still further include operational amplifier circuitry (e.g., 220) having a first input (e.g., "−") receiving the first common mode voltage signal (e.g., Vcm), a second input (e.g., "+") connected to the common mode voltage node (e.g., Vcm_ref), and an output connected to a gate of the PMOS transistor (e.g., 230).

In circuitry as described in the preceding paragraph, the locations of each of the first and second taps (e.g., 242, 252) along the resistor network (e.g., 240, 250) may be controllably variable.

In circuitry of the type described above, the first tap (e.g., 242) may be selectable from a first plurality of taps (e.g., 242a-n), each of which is at a respective different location along the resistor network between the source-drain path of the PMOS transistor (e.g., 230) and the common mode voltage node (e.g., Vcm_ref). The second tap (e.g., 252) may be selectable from a second plurality of taps (e.g., 252a-n), each of which is at a respective different location along the resistor network between the common mode voltage node (e.g., Vcm_ref) and ground (e.g., VSS).

Circuitry as described in the preceding paragraph may further include a controllably closable switch (e.g., 242), in a first plurality of switches (e.g., 242a-n), between each of the first plurality taps (e.g., 242a-n) and a first node providing a first constituent (e.g., Vrefp) of the second differential signal. The circuitry may still further include a controllably closable switch (e.g., 252), in a second plurality of switches (e.g., 252a-n) between each of the second plurality of taps (e.g., 252a-n) and a second node providing a second constituent (e.g., Vrefn) of the second differential signal.

Circuitry of the type described in the preceding paragraph may still further include circuitry (e.g., leads labelled threshold selection) for closing any selectable one of the switches (e.g., 242, 252) in each of the first and second pluralities of switches (e.g., 242a-n, 252a-n).

In circuitry as described above, the first circuitry for producing a first common mode voltage signal Vcm may include first and second resistors (e.g., 210a, 210b) connected in series between first and second constituents (e.g., Vip, Vin) of the first differential signal. A node (e.g., Vcm) that is intermediate the first and second resistors (e.g., 210a, 210b) may produce the first common mode voltage signal (e.g., Vcm).

To some extent recapitulating and/or extending certain still other possible aspects of the foregoing, differential comparator circuitry may include a differential comparator circuit 10' having first and second differential reference voltage input terminals Vrefx and Vrefy. The circuitry may further include differential reference source circuitry 200 for producing first and second differential reference voltage signals that are respectively applied to first and second output terminals Vrefp and Vrefn. The circuitry may still further include routing circuitry 280 for controllably connecting the first output terminal Vrefp to either one of the input terminals Vrefx and Vrefy, while connecting the second output terminal Vrefn to the other one of the input terminals Vrefx and Vrefy.

In circuitry of the type described in the preceding paragraph, the differential reference source circuitry may include circuitry 242/252/etc. for controllably varying a voltage difference between the first and second reference voltage signals. In this regard, note that selection of taps 242 and 252 in FIG. 6 that are relatively close to one another along resistor network causes there to be a relatively small difference between Vrefp and Vrefn. For example, selection of taps 242a and 252a causes Vrefp−Vrefn=0 or at most relatively small. At the other extreme, selection of taps 242n and 252n causes Vrefp-Vrefn to have its maximum value.

In the circuitry most recently described, the differential comparator circuit 10' may operate on a differential data signal Vip/Vin having a first common mode voltage Vcm. The differential reference source circuitry 200 may then include circuitry 220, 230, 240, 250 for maintaining a second common mode voltage Vcm_ref of the first and second reference voltage signals Vrefp and Vrefn equal to the first common mode voltage Vcm.

It will be understood that the foregoing is only illustrative of the principles of the disclosure, and that various modifications can be made by those skilled in the art without departing from the scope and spirit of the disclosure. For example, the number of taps 242 and 252 in resistor network 240/250 can be any desired number.

The invention claimed is:

1. Differential comparator circuitry comprising:
first and second circuits that are connected in parallel with one another between a source of power supply voltage and a first node that is connectable to ground, the first circuit comprising a first output portion and a first NMOS transistor, the second circuit comprising a second output portion and a second NMOS transistor, first and second constituents of a differential input signal being connected to gates of the first and second NMOS transistors, respectively;
a third NMOS transistor having its source-drain path connected in parallel with the source-drain path of the first NMOS transistor;
a fourth NMOS transistor having its source-drain path connected in parallel with the source-drain path of the second NMOS transistor; and
a source of a differential reference voltage connected to gates of the third and fourth NMOS transistors.

2. The circuitry defined in claim 1 further comprising:
register circuitry having differential data inputs that are connected to the first and second output portions.

3. The circuitry defined in claim 1 wherein the source of a differential reference voltage comprises:
a source of common mode voltage of the first and second constituents of the differential input signal; and
operational amplifier circuitry having a first input connected to the source of common mode voltage of the first and second constituents, a second input connected to a source of common mode voltage of the differential reference voltage, and an output providing a control signal for the source of common mode voltage of the differential reference voltage.

4. The circuitry defined in claim 3 wherein the source of common mode voltage of the differential reference voltage comprises:
a PMOS transistor having a gate connected to the output of the operational amplifier circuitry and a source-drain path connected in series with a resistor network between the source of power supply voltage and ground.

5. The circuitry defined in claim 4 wherein the resistor network comprises:
a first tapped resistor connected in series between the source-drain path of the PMOS transistor and a node providing the common mode voltage of the differential reference voltage; and
a second tapped resistor connected in series between the node providing the common mode voltage of the differential reference voltage and ground.

6. The circuitry defined in claim 5 wherein the node providing the common mode voltage of the differential reference voltage is connected to the second input of the operational amplifier circuitry.

7. The circuitry defined in claim 5 wherein the first tapped resistor comprises:
a plurality of first taps at respective different points along the first tapped resistor, and wherein the circuitry further comprises:
a first plurality of switches, each of which selectively connects a respective one of the first taps to a first reference voltage node that supplies a first constituent of the differential reference voltage.

8. The circuitry defined in claim 7 wherein the second tapped resistor comprises:
a plurality of second taps at respective different points along the second tapped resistor, and wherein the circuitry further comprises:
a second plurality of switches, each of which selectively connects a respective one of the second taps to a second reference voltage node that supplies a second constituent of the differential reference voltage.

9. The circuitry defined in claim 8 further comprising:
routing circuitry for controllably connecting the first reference voltage node to the gate of either one of the fourth NMOS transistor or the third NMOS transistor, while connecting the second reference voltage node to the gate of the other one of the fourth and third NMOS transistors.

10. The circuitry defined in claim 8 further comprising:
circuitry for controlling which one of the first switches will be closed and which one of the second switches will be closed.

11. The circuitry defined in claim 10 wherein the circuitry for controlling can select any one of the first switches to be closed, each of the first switches being associated with a respective one of the second switches which will also be closed when the associated first switch is closed.

12. The circuitry defined in claim 1 wherein the first output portion comprises a first output node, a first PMOS transistor and a fifth NMOS transistor, wherein the first PMOS transistor, the fifth NMOS transistor and the first NMOS transistor are connected in series with one another via their source-drain paths, the second output portion comprises a second output node, a second PMOS transistor and a sixth NMOS transistor, wherein the second PMOS transistor, the sixth NMOS transistor and the second NMOS transistor are connected in series with one another via their source-drain paths, wherein the first output node is intermediate the source-drain paths of the second PMOS and sixth NMOS transistors, wherein the second output node is intermediate the source-drain paths of the first PMOS and fifth NMOS transistors, wherein gates of the first PMOS and fifth NMOS transistors are connected to the first output node, and wherein gates of the second PMOS and sixth NMOS transistors are connected to the second output node.

13. The circuitry defined in claim 12 further comprising:
first and second selectively closable switch circuitries respectively connected in parallel with the source-drain paths of the first and second PMOS transistors;
third selectively closable switch circuitry connected between the gates of the first and second PMOS transistors; and
fourth selectively closable switch circuitry connected between the first node and ground, wherein the fourth switch circuitry closes in response to assertion of a clock signal and otherwise opens, and wherein the first, second, and third switch circuitries close in response to assertion of a complement of the clock signal and otherwise open.

14. The circuitry defined in claim 13 further comprising:
register circuitry having differential data inputs that are connected to the first and second output nodes, wherein the register circuitry is clocked to sample and store data indicated by the differential data inputs by a sampling clock signal that is asserted between assertion of the clock signal and assertion of the complement of the clock signal.

15. Circuitry for maintaining a substantially equal common mode voltage between first and second differential signals comprising:
first circuitry for producing a first common mode voltage signal indicative of the common mode voltage of the first differential signal;
second circuitry for producing the second differential signal, the second circuitry comprising a PMOS transistor having a source-drain path connected in series with a resistor network between a source of power supply voltage and ground, the resistor network having an intermediate common mode voltage node and the second differential signal being produced from first and second taps from the resistor network, the first tap being selectable from a first plurality of taps, each of which is at a respective different location along the resistor network between the source-drain path of the PMOS transistor and the common mode voltage node, and the second tap being selectable from a second plurality of taps, each of which is at a respective different location along the resistor network between the common mode voltage node and ground; and
operational amplifier circuitry having a first input receiving the first common mode voltage signal, a second input connected to the common mode voltage node, and an output connected to a gate of the PMOS transistor.

16. The circuitry defined in claim 15 wherein the selections of the first and second taps along the resistor network are controllably variable.

17. The circuitry defined in claim 15 further comprising:
a controllably closable switch, in a first plurality of switches, between each of the first plurality of taps and a first node providing a first constituent of the second differential signal; and
a controllably closable switch, in a second plurality of switches, between each of the second plurality of taps and a second node providing a second constituent of the second differential signal.

18. The circuitry defined in claim 17 further comprising:
circuitry for closing any selectable one of the switches in each of the first and second pluralities of switches.

19. The circuitry defined in claim 15 wherein the first circuitry comprises:
first and second resistors connected in series between first and second constituents of the first differential signal, a node that is intermediate the first and second resistors producing the first common node voltage signal.

20. Differential comparator circuitry comprising:
a differential comparator circuit having first and second differential reference voltage input terminals and operating on a differential data signal having a first common mode voltage;
differential reference source circuitry for producing first and second differential reference voltage signals that are respectively applied to first and second output terminals, comprising circuitry for maintaining a second common mode voltage of the first and second reference voltage signals equal to the first common mode voltage; and
routing circuitry for controllably connecting the first output terminal to either one of the input terminals, while connecting the second output terminal to the other one of the input terminals.

21. The circuitry defined in claim 20 wherein the differential reference source circuitry comprises:
circuitry for controllably varying a voltage difference between the first and second reference voltage signals.

* * * * *